United States Patent
Akkem

(10) Patent No.: US 11,979,171 B2
(45) Date of Patent: May 7, 2024

(54) REDUCED COMPLEXITY ENCODERS AND RELATED SYSTEMS, METHODS, AND DEVICES

(71) Applicant: Microchip Technology Incorporated, Chandler, AZ (US)

(72) Inventor: Sailaja Akkem, Austin, TX (US)

(73) Assignee: Microchip Technology Incorporated, Chandler, AZ (US)

( * ) Notice: Subject to any disclaimer, the term of this patent is extended or adjusted under 35 U.S.C. 154(b) by 0 days.

(21) Appl. No.: 17/448,090

(22) Filed: Sep. 20, 2021

(65) Prior Publication Data

US 2022/0116059 A1 Apr. 14, 2022

Related U.S. Application Data

(60) Provisional application No. 63/198,357, filed on Oct. 13, 2020.

(51) Int. Cl.
*H03M 13/11* (2006.01)
*G06F 7/523* (2006.01)
*H03K 19/21* (2006.01)
*H03M 13/00* (2006.01)
*H04L 1/00* (2006.01)

(52) U.S. Cl.
CPC ......... *H03M 13/1174* (2013.01); *G06F 7/523* (2013.01); *H03K 19/21* (2013.01); *H03M 13/616* (2013.01); *H04L 1/0041* (2013.01); *H04L 1/0057* (2013.01)

(58) Field of Classification Search
None
See application file for complete search history.

(56) References Cited

U.S. PATENT DOCUMENTS

| | | |
|---|---|---|
| 9,092,353 B1 | 7/2015 | Micheloni et al. |
| 9,355,837 B2 | 5/2016 | Marsh |
| 10,147,875 B1 | 12/2018 | Hansen et al. |

(Continued)

FOREIGN PATENT DOCUMENTS

| | | | |
|---|---|---|---|
| WO | 2017/023693 A1 | 2/2017 | |
| WO | WO-2020131056 A1 * | 6/2020 | ........... H04L 1/0041 |

OTHER PUBLICATIONS

Amendment 7: Media Access Control Parameters, Physical Layers, and Management Parameters for 2.5 GB/s and 5 GB/s Operation, Types 2.5GBASE-T and 5GBASE-T (Year: 2016).*

(Continued)

*Primary Examiner* — Guerrier Merant
(74) *Attorney, Agent, or Firm* — TraskBritt

(57) ABSTRACT

Reduced complexity encoders and related systems, apparatuses, and methods are disclosed. An apparatus includes a data storage device and a processing circuitry. The data storage device is to store a first data part of a transmit data frame. The transmit data frame is received from one or more higher network layers that are higher than a physical layer. The transmit data frame includes the first data part and a second data part. The second data part includes data bits having known values. The processing circuitry is to retrieve the first data part of the transmit data frame from the data storage device and determine parity vectors for the transmit data frame independently of the second data part responsive to the first data part.

21 Claims, 5 Drawing Sheets

(56) References Cited

U.S. PATENT DOCUMENTS

| | | |
|---|---|---|
| 10,319,583 B2 | 6/2019 | Li et al. |
| 10,410,857 B2 | 9/2019 | Suzuki et al. |
| 2004/0025787 A1 | 2/2004 | Selbrede et al. |
| 2006/0195761 A1 | 8/2006 | Kim et al. |
| 2007/0083802 A1 | 4/2007 | Xin et al. |
| 2007/0153726 A1* | 7/2007 | Bar-Sade .............. H04L 1/0002 370/466 |
| 2009/0086638 A1 | 4/2009 | Niu et al. |
| 2010/0146365 A1 | 6/2010 | Yano et al. |
| 2011/0191653 A1 | 8/2011 | Zeng et al. |
| 2011/0256734 A1 | 10/2011 | Hausmann et al. |
| 2014/0273527 A1 | 9/2014 | Haukka et al. |
| 2014/0273528 A1 | 9/2014 | Niskanen et al. |
| 2014/0273530 A1 | 9/2014 | Nguyen et al. |
| 2015/0099375 A1 | 4/2015 | Haripin et al. |
| 2015/0200110 A1 | 7/2015 | Li et al. |
| 2016/0068953 A1 | 3/2016 | Li et al. |
| 2017/0359147 A1 | 12/2017 | Park et al. |
| 2019/0068314 A1 | 2/2019 | Park et al. |
| 2019/0149169 A1 | 5/2019 | Chang et al. |
| 2019/0157057 A1 | 5/2019 | Stewart |

OTHER PUBLICATIONS

Shirani et al., "PMA/PCS Consensus Baseline Proposal; Shirani_3bz_02_0515", IEEE Draft: Shirani_3BZ_02_0515, IEEE-SA, Piscataway, NJ USA, vol. 802.3 (May 21, 2015) pp. 1-6.

"IEEE Standard for Ethernet," in IEEE Std 802.3-2018 (Revision of IEEE Std 802.3-2015), vol. No., pp. 1-5600, Aug. 31, 2018, doi: 10.1109/IEEESTD.2018.8457469.

Cohen et al., "A Low-Complexity Hybrid LDPC Code Encoder for IEEE 802.3an (10GBase-T) Ethernet", IEEE Transactions on Signal Processing, vol. 57, No. 10, Oct. 2009, 10 pages.

International Search Report for International Application No. PCT/US2021/071622, dated Apr. 21, 2022, 4 pages.

International Written Opinion for International Application No. PCT/US2021/071622, dated Apr. 21, 2022, 11 pages.

\* cited by examiner

REDUCED COMPLEXITY ENCODERS AND RELATED SYSTEMS, METHODS, AND DEVICES

CROSS-REFERENCE TO RELATED APPLICATION

This application claims the benefit under 35 U.S.C. § 119(e) of the priority date of U.S. Provisional Patent Application Ser. No. 63/198,357, filed Oct. 13, 2020, the disclosure of which is incorporated herein in its entirety by this reference.

TECHNICAL FIELD

This disclosure relates generally to reduced complexity encoders, and more specifically to reduced complexity low density parity check code (LDPC) encoders for use in physical layer devices networks such as wired local area networks.

BACKGROUND

The Institute of Electrical and Electronics Engineers (IEEE) regulates operation of encoders in wired local area networks such as Ethernet in its IEEE 802.3bz standard, also referred to herein as the 2.5 gigabit per second (Gbit/s) and 5 Gbit/s standard, or more simply "2.5/5G" or "the standard." To achieve the bit-error rate (BER) specified by the Ethernet standards for 2.5/5G, a low-density parity check (LDPC) algorithm is used to encode and decode the data. Data from layers higher than the physical layer is encoded into an LDPC frame by the transmitter. Each LDPC frame is of size 2048 bits, out of which 325 bits are parity bits and 1723 bits are the incoming message bits from higher network layers than the physical layer.

LDPC algorithms provide error correction as needed by Ethernet standards, which specify a bit error rate (BER) of less than $10^{-12}$. The standard specifies the use of a generator matrix (G-Matrix), which is used to encode the incoming frame data according to $C = s*G^T$, where s is the incoming data vector, $G^T$ is the matrix transpose of the G-Matrix, C is the coded vector, and * is the matrix multiplication operator.

BRIEF DESCRIPTION OF THE DRAWINGS

While this disclosure concludes with claims particularly pointing out and distinctly claiming specific examples, various features and advantages of examples within the scope of this disclosure may be more readily ascertained from the following description when read in conjunction with the accompanying drawings, in which:

DETAILED DESCRIPTION

Figure 1:
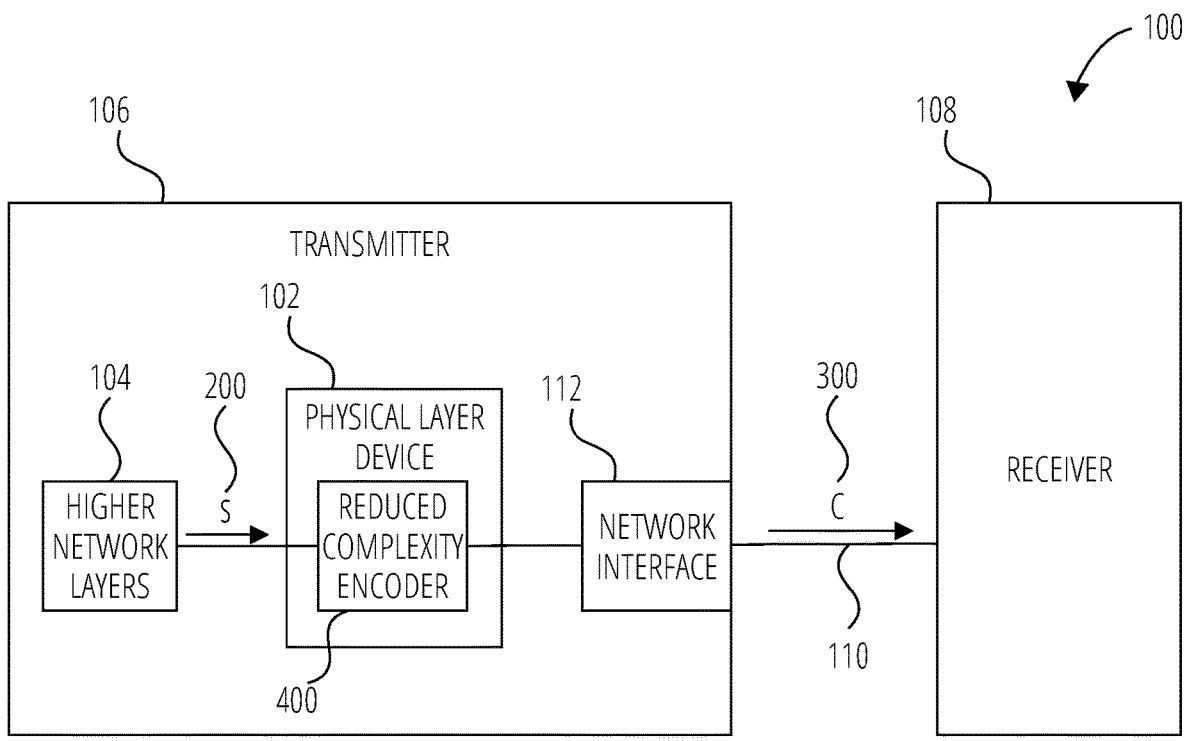
FIG. 1 is a block diagram of a communication system, according to various examples.

In the following detailed description, reference is made to the accompanying drawings, which form a part hereof, and in which are shown, by way of illustration, specific examples in which the present disclosure may be practiced. These examples are described in sufficient detail to enable a person of ordinary skill in the art to practice the present disclosure. However, other examples enabled herein may be utilized, and structural, material, and process changes may be made without departing from the scope of the disclosure.

The illustrations presented herein are not meant to be actual views of any particular method, system, device, or structure, but are merely idealized representations that are employed to describe the examples of the present disclosure. In some instances similar structures or components in the various drawings may retain the same or similar numbering for the convenience of the reader; however, the similarity in numbering does not necessarily mean that the structures or components are identical in size, composition, configuration, or any other property.

The following description may include examples to help enable one of ordinary skill in the art to practice the disclosed examples. The use of the terms "exemplary," "by example," and "for example," means that the related description is explanatory, and though the scope of the disclosure is intended to encompass the examples and legal equivalents, the use of such terms is not intended to limit the scope of an example or this disclosure to the specified components, steps, features, functions, or the like.

It will be readily understood that the components of the examples as generally described herein and illustrated in the drawings could be arranged and designed in a wide variety of different configurations. Thus, the following description of various examples is not intended to limit the scope of the present disclosure, but is merely representative of various examples. While the various aspects of the examples may be presented in the drawings, the drawings are not necessarily drawn to scale unless specifically indicated.

Furthermore, specific implementations shown and described are only examples and should not be construed as the only way to implement the present disclosure unless specified otherwise herein. Elements, circuits, and functions may be shown in block diagram form in order not to obscure the present disclosure in unnecessary detail. Conversely, specific implementations shown and described are exemplary only and should not be construed as the only way to implement the present disclosure unless specified otherwise herein. Additionally, block definitions and partitioning of logic between various blocks is exemplary of a specific implementation. It will be readily apparent to one of ordinary skill in the art that the present disclosure may be practiced by numerous other partitioning solutions. For the most part, details concerning timing considerations and the like have been omitted where such details are not necessary to obtain a complete understanding of the present disclosure and are within the abilities of persons of ordinary skill in the relevant art.

Those of ordinary skill in the art will understand that information and signals may be represented using any of a variety of different technologies and techniques. Some drawings may illustrate signals as a single signal for clarity of presentation and description. It will be understood by a person of ordinary skill in the art that the signal may represent a bus of signals, wherein the bus may have a variety of bit widths and the present disclosure may be implemented on any number of data signals including a single data signal.

The various illustrative logical blocks, modules, and circuits described in connection with the examples disclosed herein may be implemented or performed with a general purpose processor, a special purpose processor, a digital signal processor (DSP), an Integrated Circuit (IC), an Application Specific Integrated Circuit (ASIC), a Field Programmable Gate Array (FPGA) or other programmable logic device, discrete gate or transistor logic, discrete hardware components, or any combination thereof designed to perform the functions described herein. A general-purpose processor (may also be referred to herein as a host processor or simply a host) may be a microprocessor, but in the alternative, the processor may be any conventional processor, controller, microcontroller, or state machine. A processor may also be implemented as a combination of computing devices, such as a combination of a DSP and a microprocessor, a plurality of microprocessors, one or more microprocessors in conjunction with a DSP core, or any other such configuration. A general-purpose computer including a processor is considered a special-purpose computer while the general-purpose computer is to execute computing instructions (e.g., software code) related to examples of the present disclosure.

The examples may be described in terms of a process that is depicted as a flowchart, a flow diagram, a structure diagram, or a block diagram. Although a flowchart may describe operational acts as a sequential process, many of these acts can be performed in another sequence, in parallel, or substantially concurrently. In addition, the order of the acts may be re-arranged. A process may correspond to a method, a thread, a function, a procedure, a subroutine, a subprogram, other structure, or combinations thereof. Furthermore, the methods disclosed herein may be implemented in hardware, software, or both. If implemented in software, the functions may be stored or transmitted as one or more instructions or code on computer-readable media. Computer-readable media includes both computer storage media and communication media including any medium that facilitates transfer of a computer program from one place to another.

Any reference to an element herein using a designation such as "first," "second," and so forth does not limit the quantity or order of those elements, unless such limitation is explicitly stated. Rather, these designations may be used herein as a convenient method of distinguishing between two or more elements or instances of an element. Thus, a reference to first and second elements does not mean that only two elements may be employed there or that the first element must precede the second element in some manner. In addition, unless stated otherwise, a set of elements may include one or more elements.

As used herein, the term "substantially" in reference to a given parameter, property, or condition means and includes to a degree that one of ordinary skill in the art would understand that the given parameter, property, or condition is met with a small degree of variance, such as, for example, within acceptable manufacturing tolerances. By way of example, depending on the particular parameter, property, or condition that is substantially met, the parameter, property, or condition may be at least 90% met, at least 95% met, or even at least 99% met.

LDPC encoders may be hardware-expensive due to the size of the G-matrix used in encoding. Relatively significant hardware may be used to enable LDPC encoding. Other variations of encoding also use relatively significant hardware for storage of variant-matrices. Examples disclosed herein enable reduction of hardware used for encoding the frame.

For 2.5G/5G speeds, the incoming data rate is 65 bits per clock for 25 clock cycles after 64b-65b encoding of the incoming XGMII data. This would result in accumulating 65×25=1625 bits over 25 clock cycles. To these 1625 bits, 98 bits are added as per the IEEE standard to form 1723 bits. Accordingly, the encoder would process 1723 bits over 25 clock cycles even though the incoming data is 1625 bits over 25 clock cycles. This would mean that the encoder would need more than one bit time to process each bit, which would require parallel hardware of some sort or additional clock cycles to encode the frame. As compared to non-parallel hardware, parallel hardware may be relatively complicated, consume relatively large amounts of power, and occupy relatively large amounts of area (e.g., "real-estate") on a semiconductor device chip. In addition, encoding the frame in this way consumes a relatively large amount of storage for storing matrices needed for multiplying the incoming frame content per clock cycle. This area consumed can be reduced if known information from the frame is used.

Examples disclosed herein enable reduction of encoder processing time for each bit of incoming data. For example, examples disclosed herein may reduce encoder processing time to just one bit time or less for each bit. As a result, parallel hardware may not be needed to implement the encoder. Simplification of hardware, as compared to parallel hardware, may thus be enabled by examples disclosed herein.

As previously mentioned, encoders according to examples disclosed herein may occupy less chip area than encoders that employ parallel hardware. By way of non-limiting example, examples disclosed herein may enable reduction of chip area by 50% or more (e.g., substantially 55% to 60%).

Examples disclosed herein may include low-complexity LDPC encoders suitable for use in physical layer devices in wired local area networks such as Ethernet.

In various examples an apparatus includes a data storage device and a processing circuitry. The data storage device is to store a first data part of a transmit data frame. The transmit data frame is received from one or more higher network layers that are higher than a physical layer. The transmit data frame includes the first data part and a second data part. The second data part includes data bits having known values. The processing circuitry is to retrieve the first data part of the transmit data frame from the data storage device and determine parity vectors for the transmit data frame independently of the second data part responsive to the first data part.

In various examples a method of generating parity vectors includes dividing, at a physical layer device, a first data part from a transmit data frame. The transmit data frame includes at least the first data part and a second data part. The second data part includes data bits having known values. The transmit data frame is received from a network layer higher than a physical layer. The method also includes determining parity vectors for the transmit data frame independently of the second data part based, at least in part, on the first data part.

In various examples a communication system includes a network interface to communicatively interface with a receiver and a physical layer device including a reduced complexity encoder to generate a low density parity-check code (LDPC) frame responsive to a first data part of a transmit data frame independently from a second data part of the transmit data frame, the transmit data frame received from higher network layers that are higher than a physical layer, and provide the LDPC frame through the network interface to a receiver.

FIG. 1 is a block diagram of a communication system 100, according to various examples. The communication system includes transmitter 106, a receiver 108, and a wired local area network cable 110. The transmitter 106 is to provide an LDPC frame C 300 to the receiver 108 through the wired local area network cable 110.

The transmitter 106 includes a physical layer device 102, higher network layers 104, and a network interface 112. The network interface 112 is to communicatively interface with the receiver 108. The physical layer device 102 includes a reduced complexity encoder 400 to generate the LDPC frame C 300 frame responsive to a first data part of a transmit data frame s 200 independently from a second data part of the transmit data frame s 200. The transmit data frame s 200 is received from the higher network layers 104, which are higher than a physical layer. The physical layer device 102 is to provide the LDPC frame C 300 through the network interface 112 to the receiver 108.

Figure 2:
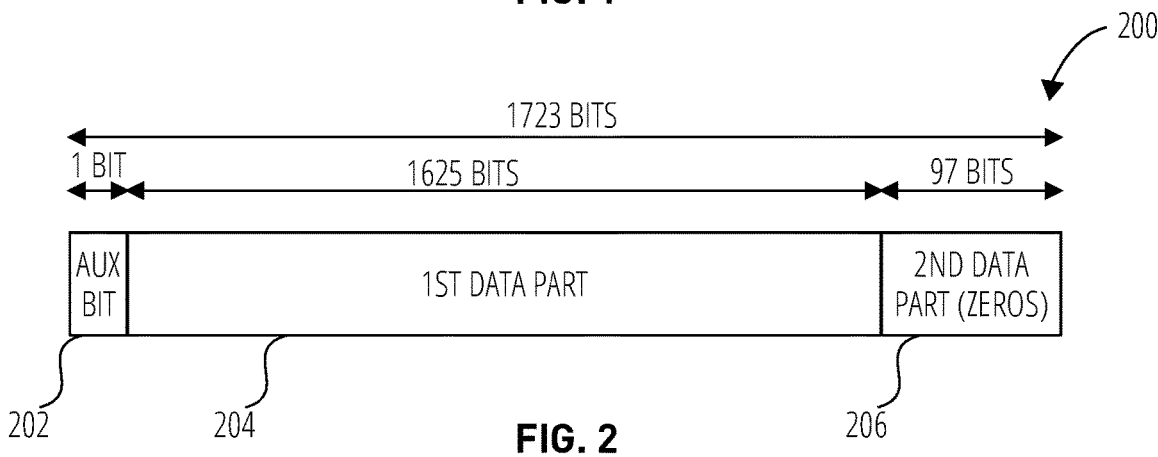
FIG. 2 illustrates a transmit data frame provided by higher network layers of a transmitter of the communication system of FIG. 1, according to various examples.

FIG. 2 illustrates a transmit data frame s 200 provided by higher network layers 104 of the transmitter 106 of the communication system 100 of FIG. 1, according to various examples. The transmit data frame s 200 includes an auxiliary bit 202, a first data part 204, and a second data part 206. By way of non-limiting examples, the auxiliary bit 202 may be one bit long, the first data part 204 may be 1,625 bits long, and the second data part 206 may be 97 bits long. A total length of the transmit data frame s 200 may be 1,723 bits. The first data part 204 may include data bits that are to be communicated to the receiver 108 (FIG. 1). As per the 2.5G/5G standard, the second data part (data-part-2) is all zeros.

Figure 3:
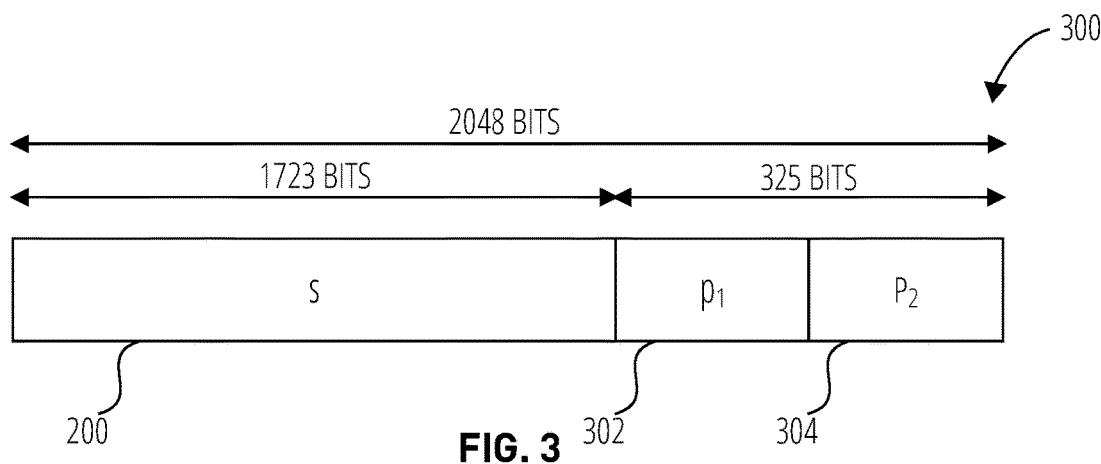
FIG. 3 illustrates an LDPC frame provided by the transmitter of the communication system of FIG. 1, according to various examples.

FIG. 3 illustrates an LDPC frame C 300 provided by the transmitter 106 of the communication system 100 of FIG. 1, according to various examples. The LDPC frame C 300 includes the transmit data frame s 200 of FIG. 1 and FIG. 2, a first parity vector $p_1$ 302, and a second parity vector $p_2$ 304. By way of non-limiting example, the transmit data frame s 200 may be of length 1723 bits, as discussed above with reference to FIG. 2. Also by way of non-limiting example, the first parity vector $p_1$ 302 and the second parity vector $p_2$ 304 may combine for a total length of 325 bits. A total length of the LDPC frame C 300 may be 2048 bits.

Figure 4:
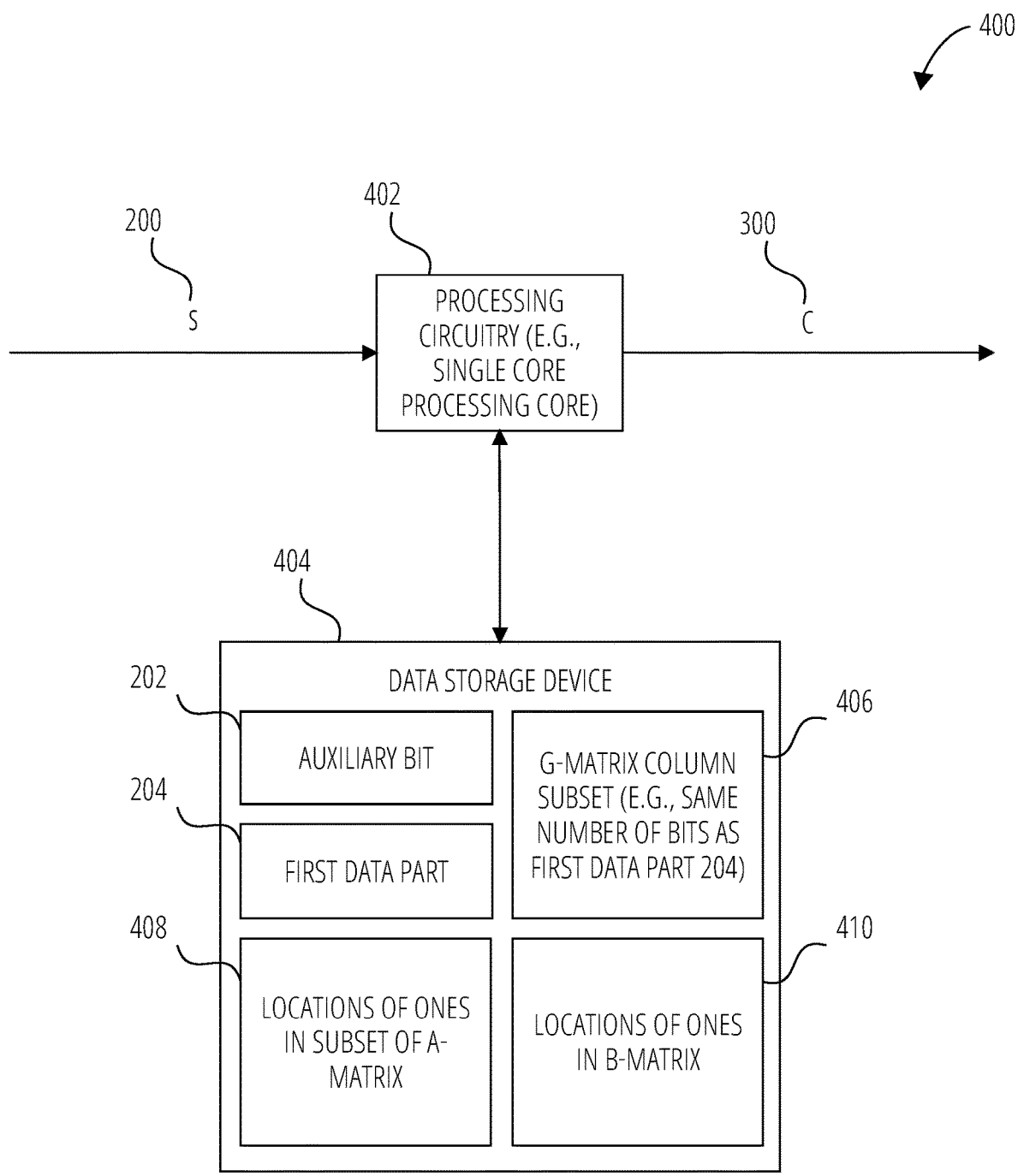
FIG. 4 is a block diagram of a reduced complexity encoder of the transmitter of the communication system of FIG. 1, according to various examples.

FIG. 4 is a block diagram of the reduced complexity encoder 400 of the transmitter 106 of the communication system 100 of FIG. 1, according to various examples. The reduced complexity encoder 400 includes a processing circuitry 402 (e.g., a single core processing core) electrically connected to a data storage device 404.

As discussed below, reduced complexity encoder 400 is to use only the auxiliary bit 202 of the transmit data frame s 200, the first data part 204 of the transmit data frame s 200, a G-matrix column subset 406 including a subset of a column of a generator matrix (also referred to herein as "G-matrix"), a subset of an A-matrix (which itself is a subset of a parity check matrix, or equivalently the "H-matrix"), and a B-matrix (which is a subset of the H-matrix) to determine the parity vectors (i.e., first parity vector $p_1$ 302 and second parity vector $p_2$ 304 of FIG. 3) of the LDPC frame C 300. The G-matrix column subset 406 includes fewer bits than an entirety of the column of the G-matrix. The G-matrix column subset 406 may include a same number of bits (e.g., 1,625 bits) as the first data part 204. Accordingly, the data storage device 404 may store only that information that the reduced complexity encoder 400 uses to determine the parity vectors. Specifically, the data storage device 404 may store only the auxiliary bit 202, the first data part 204, the G-matrix column subset 406, locations 408 of ones in the subset of the A-matrix, and locations 410 of ones in the B-matrix. The data storage device 404 may not store the second data part 206.

For LDPC coding the H-matrix is relatively sparse. As a result, less data storage may be used to store data indicating the locations 408 of ones in the subset of the A-matrix and the locations 410 of ones in the B-matrix than would be used to store the subset of the A-matrix and the B-matrix themselves. Accordingly, rather than store the subset of the A-matrix and the B-matrix themselves, the data storage device 404 may store the locations 408 and the locations 410.

The processing circuitry 402 is to divide the transmit data frame s 200 into the auxiliary bit 202, the first data part 204, and the second data part 206. The processing circuitry 402 is to determine the first parity vector $p_1$ 302 independently of both the auxiliary bit 202 and the second data part 206. The processing circuitry 402 is also to determine the second parity vector $p_2$ 304 independently of the second data part 206 based, at least in part, on the auxiliary bit 202.

Figures 5, 6:
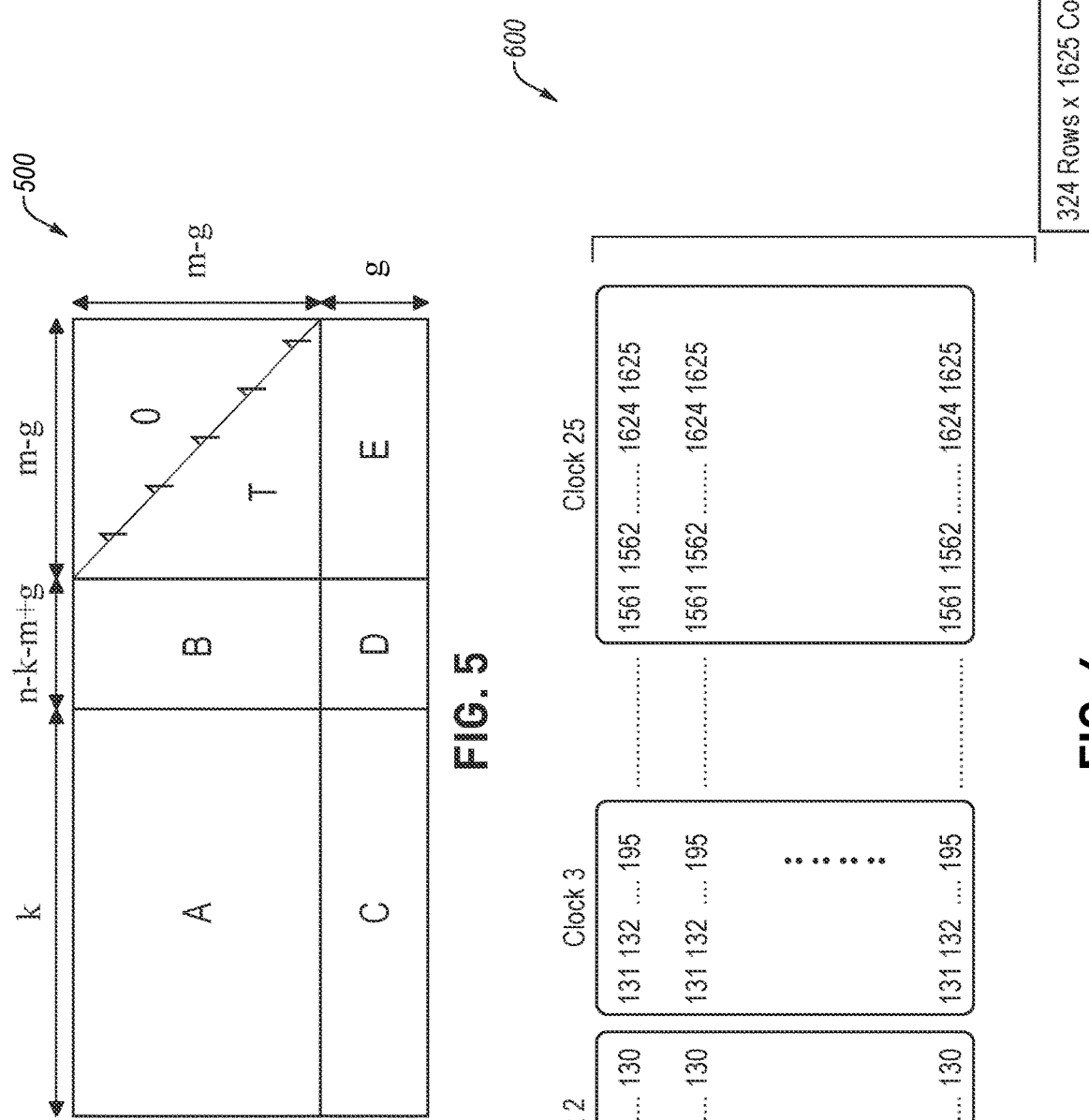
FIG. 5 is a graphical representation of a Richardson-Urbanke restructuring of a parity check matrix, or equivalently "H-matrix," according to various examples.
FIG. 6 illustrates segmentation of an A-matrix subset (e.g., the A-matrix being a subset of a parity check matrix or H-matrix), according to various examples.

FIG. 5 is a graphical representation of a Richardson-Urbanke restructuring of a parity check matrix 500, or equivalently "H-matrix 500," according to various examples. In various examples optimizations on top of hybrid-Richardson-Urbanke (hybrid-RU) encoding and the use of known information in LDPC frames (e.g., the LDPC frame C 300 of FIG. 1, FIG. 3, and FIG. 4) may be implemented.

Referring to FIG. 4 and FIG. 5 together, as previously discussed, the LDPC frame C 300 may be divided into three parts: an auxiliary bit 202 (one bit long), a first data part 204 (1625 bits long), and a second data part 206 (97 bits long). The contribution of each part of the LDPC frame C 300 may be evaluated towards parity calculations per clock. As per the 2.5G/5G standard, the second data part 206 is all zeros. As a result, zeros corresponding to the second data part 206 are not stored by the data storage device 404 (FIG. 4), which decreases the amount of storage used to store an LDPC frame C 300 while encoding the LDPC frame C 300.

Also, columns of sub-matrices (the A-matrix, shown as subset "A" of the H-matrix 500, the B-matrix, shown as subset "B" of the H-matrix 500, and the G-matrix) that do not contribute to parity for their complete column width are identified. Furthermore, sub-matrix A (the A-matrix) may be divided into sub-matrices to facilitate its storage with minimal hardware (e.g., reducing the size of the data storage device 404). Using the known information in the LDPC frame C 300 and using knowledge of the columns that do not contribute to generation of the parity vectors (first parity vector $p_1$ 302 and second parity vector $p_2$ 304) for their complete column width, the processing time of the reduced complexity encoder 400 may be reduced to one bit time per bit. As a result, the reduced complexity encoder 400 may be implemented using a single core processor, reducing the hardware of the reduced complexity encoder 400 as compared to implementations using parallel hardware.

An LDPC encoder (e.g., the reduced complexity encoder 400) may calculate an LDPC encoded frame C (LDPC frame C 300) from an incoming transmit data frame s 200 as C=[s $p_1$ $p_2$], where $p_1$ and $p_2$ are the parity vectors (first parity vector $p_1$ 302 and second parity vector $p_2$ 304) that should be calculated. Multiplying the incoming transmit data frame s 200 by the matrix contents of the G-matrix per clock to provide the parity vectors may involve storing the G-matrix, which may be of size [1723×325], or other variations of the H-matrix [A, B, G, T], which would consume a relatively large amount of storage on the chip. Using a hybrid Richardson-Urbanke method, however, the first parity vector $p_1$ 302 and the second parity vector $p_2$ 304 may be determined as follows:

$$p_1^T = s * G(:,k+1:n-(m-g))$$

$$p_2^T = -T^{-1}(As^T + Bp_1^T).$$

Parity vector $p_1$ may be determined using one column of the G-Matrix (sometimes referred to herein as "G-Mat-Column," or "G(:,k+1:n−(m−g))" in the above equation), which is of size 1×1723 bits, and which is the same length as the transmit data frame s 200. Accordingly, $p_1$=s*G-Mat-Column. For 2.5G/5G speeds, however, the second data part 206 (sometimes referred to herein as "data-part-2") of the incoming transmit data frame s 200 does not contribute to the calculation of first parity vector $p_1$ 302. Thus, the data storage device 404 may not store 97 bits corresponding to the second data part 206 of the column of the G-matrix (G-Mat-Column) (i.e., the part of the column of the G-matrix that would be multiplied by the zeros of the second data part 206 are not stored).

The contribution of the auxiliary bit 202 (sometimes referred to herein as "aux-bit") to the calculation of the parity vector $p_1$ is determined by a first bit of the column of the G-matrix (sometimes referred to herein as "G-Mat-Column(1,1)"). The first bit of the column of the G-matrix, however, may be known to be zero. Accordingly, the contribution of the auxiliary bit (aux-bit) toward the calculation of the parity vector $p_1$ is zero because multiplying the value of the auxiliary bit 202 by the zero of the first bit of the G-matrix column results in zero. As a result, the calculation of the parity vector $p_1$ may be performed using 1625 incoming bits only (the first data part 204 only) instead of 1723 bits, where 1625=(1723 incoming bits of the first data part 204 minus 97 bits of the second data part 206, and minus one bit of the auxiliary bit 202).

FIG. 6 illustrates segmentation of an A-matrix subset 600, according to various examples. The calculation of the second parity vector $p_2$ 304 is based, at least in part, on calculating $A*s^T$ per clock cycle. This conventionally involved saving the A-matrix, which is of size 324 rows by 1723 columns of bits. For 2.5G/5G speeds, however, the second data part 206 (FIG. 2) (data-part-2) does not contribute to parity. Thus, beyond the 1627th column of the A-matrix may not be saved and only the first to the 1626th column of the A-matrix may be used.

The A-matrix subset 600 may be stored effectively to minimize hardware. The A-matrix subset 600 may be partitioned into 25 different segments or sub-matrices (e.g., first segment 602, second segment 604, third segment 606, . . . , and 25th segment 608) such that the number of ones per row per segment is less than or equal to five. This segmentation is shown in FIG. 6. After segmenting in this way, instead of saving the entire row, only 35 bits per row per segment may be stored such that every seven bits indicate the position of a one. If there are less than five ones in that row for that segment, then an 'h65 may be stored in its place. Segmenting and storing the A-matrix subset 600 in this way would save 243,000 (25×30×324) bits of storage space.

It is noted that 1626 columns of A are used to calculate parity vector $p_2$. Out of all the 1626 columns of the A-matrix, the entire 1626th column has only five ones. Accordingly, instead of storing that full column of A, five XOR gates may be used to compute the second parity vector $p_2$ 304 from that column. These XOR gates may operate on the 1625th bit of the first data part 204 (data-part-1), which comes in the 25th clock cycle. Thus, at the end of the 25th clock cycle, $(A*s^T)$ used for calculating the second parity vector $p_2$ 304 may be calculated using these five XOR gates rather than fetching the 1626th column of A and multiplying it with s in that clock cycle. As a result, the calculation for the second parity vector $p_2$ 304 may be performed using 1625 incoming bits only.

The second parity vector $p_2$ 304 may be computed (B*$p_1$T) per clock cycle, which may involve obtaining a B-matrix per clock cycle and multiplying the B-matrix with the first parity vector $p_1$ 302, which was calculated for that clock cycle of incoming data. The B-matrix may be relatively sparse, however, and the number of ones in the B-matrix may be only five. Thus, instead of storing the entire B-matrix and implementing a fetching logic, just five XOR gates may be used to implement the logic needed for (B*$p_1$T) operation.

Encoder processing time may be one bit time per bit only if both the first parity vector $p_1$ 302 and the second parity vector $p_2$ 304 are calculated in one bit time. The calculation of the first parity vector $p_1$ 302 may depend only on 1625 bits. Thus, the first parity vector $p_1$ 302 may be computed in one bit time per bit. Similarly, the calculation of the second parity vector $p_2$ 304 depends only on 1625 bits. Thus, the second parity vector $p_2$ 304 may also be calculated in one bit time per bit.

Interesting columns of sub-matrices (A-matrix, B-matrix, and G-matrix) may be identified, which do not contribute to parity for their complete column widths. The A-matrix may be segmented and stored such that the number of bits needed for storage are minimal when compared to storing the full A-matrix.

Figure 7:
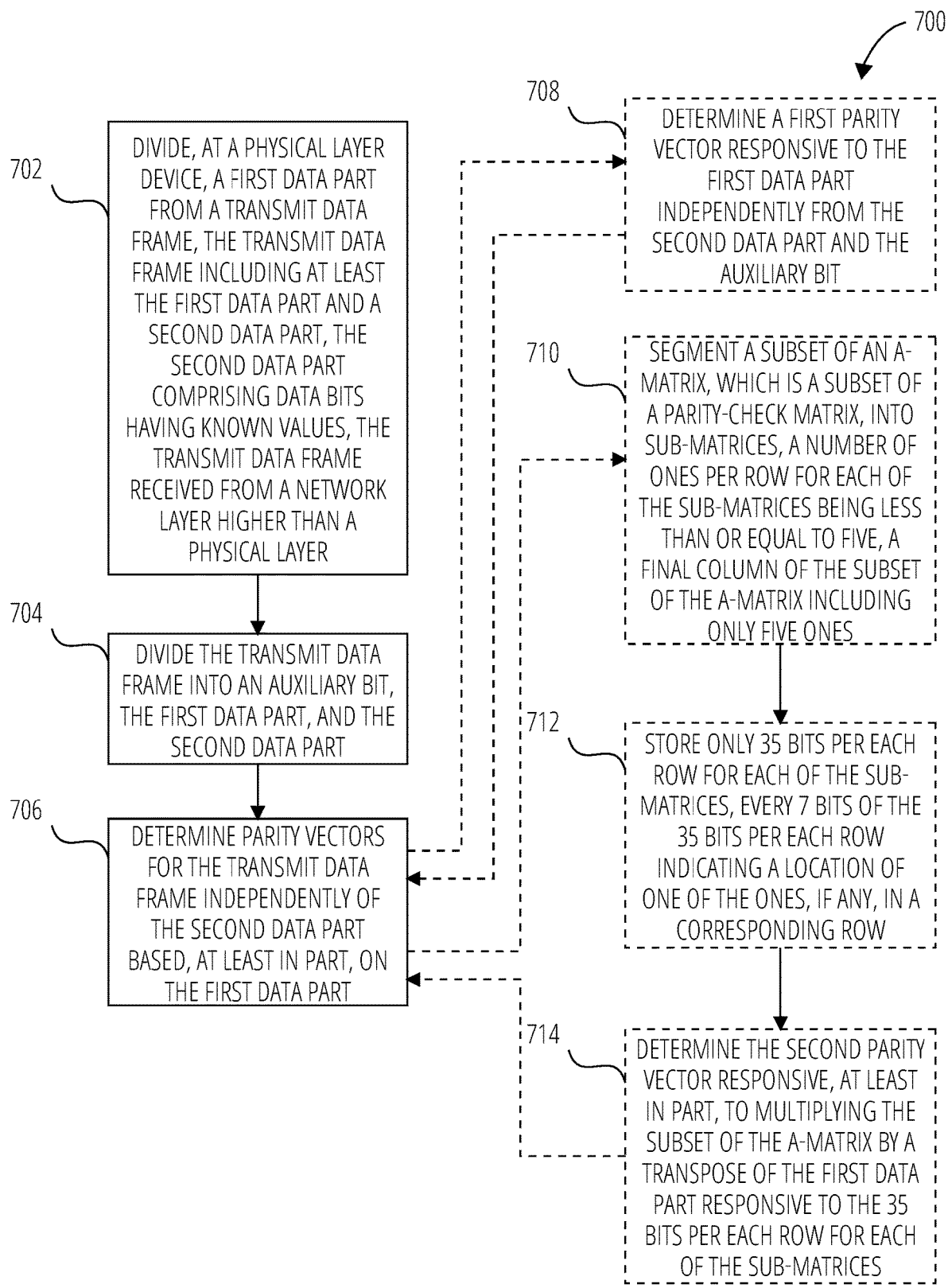
FIG. 7 is a flowchart illustrating a method of generating parity vectors, according to various examples.

FIG. 7 is a flowchart illustrating a method 700 of generating parity vectors (e.g., the first parity vector $p_1$ 302 and the first parity vector $p_1$ 302 of the LDPC frame C 300 of FIG. 3), according to various examples. At operation 702 the method 700 includes dividing, at a physical layer device (e.g., the physical layer device 102 of FIG. 1), a first data part (e.g., the first data part 204 of FIG. 2) from a transmit data frame (e.g., the transmit data frame s 200 of FIG. 2). The transmit data frame includes at least the first data part and a second data part (e.g., the second data part 206 of FIG. 2). The second data part includes data bits having known values (e.g., zeros). The transmit data frame is received from a network layer higher than a physical layer (e.g., higher network layers 104). At operation 704 the method 700 includes dividing the transmit data frame into an auxiliary bit (e.g., the auxiliary bit 202 of FIG. 2), the first data part, and the second data part.

At operation 706 the method 700 includes determining parity vectors (e.g., the first parity vector $p_1$ 302 and the second parity vector $p_2$ 304 of FIG. 3) for the transmit data frame independently of the second data part based, at least in part, on the first data part. In various examples determining parity vectors independently of the second data part includes determining a first parity vector, which may include operation 708, determining the first parity vector responsive to the first data part independently from the second data part and the auxiliary bit.

In various examples determining the parity vectors independently of the second data part includes operation 710, operation 712, and operation 714. Operation 710 includes segmenting a subset of an A-matrix, which is a subset of a parity-check matrix, into sub-matrices. A number of ones per row for each of the sub-matrices is less than or equal to five. A final column of the subset of the A-matrix includes only five ones. Operation 712 includes storing only 35 bits per each row for each of the sub-matrices. Every 7 bits of the 35 bits per each row indicates a location of one of the ones, if any, in a corresponding row. Operation 714 includes determining the second parity vector responsive, at least in part, to multiplying the subset of the A-matrix by a transpose of the first data part responsive to the 35 bits per each row for each of the sub-matrices. In various examples multiplying the subset of the A-matrix by a transpose of the first data part responsive to the 35 bits per each row for each of the sub-matrices includes performing the multiplying using five XOR gates.

Figure 8:
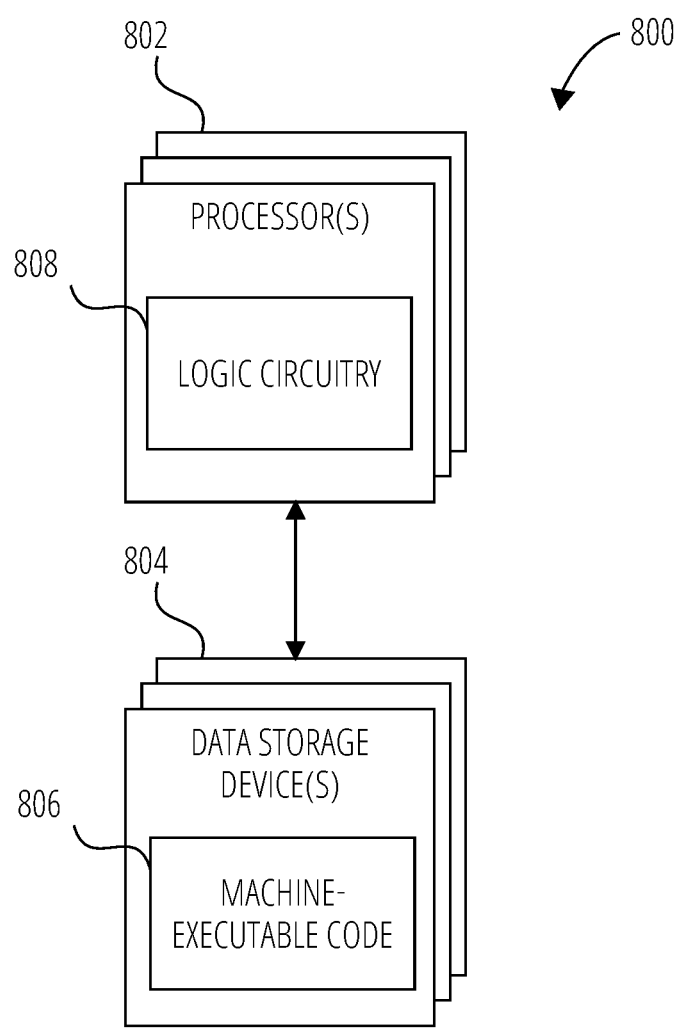
FIG. 8 is a block diagram of circuitry that, in various examples, may be used to implement various functions, operations, acts, processes, and/or methods disclosed herein.

It will be appreciated by those of ordinary skill in the art that functional elements of examples disclosed herein (e.g., functions, operations, acts, processes, and/or methods) may be implemented in any suitable hardware, software, firmware, or combinations thereof. FIG. 8 illustrates non-limiting examples of implementations of functional elements disclosed herein. In various examples, some or all portions of the functional elements disclosed herein may be performed by hardware specially configured for carrying out the functional elements.

FIG. 8 is a block diagram of circuitry 800 that, in various examples, may be used to implement various functions, operations, acts, processes, and/or methods disclosed herein. The circuitry 800 includes one or more processors 802 (sometimes referred to herein as "processors 802") operably coupled to one or more data storage devices (sometimes referred to herein as "storage 804"). The storage 804 includes machine-executable code 806 stored thereon and the processors 802 include logic circuitry 808. The machine-executable code 806 includes information describing functional elements that may be implemented by (e.g., performed by) the logic circuitry 808. The logic circuitry 808 is adapted to implement (e.g., perform) the functional elements described by the machine-executable code 806. The circuitry 800, when executing the functional elements described by the machine-executable code 806, should be considered as special purpose hardware for carrying out functional elements disclosed herein. In various examples the processors 802 may perform the functional elements described by the machine-executable code 806 sequentially, concurrently (e.g., on one or more different hardware platforms), or in one or more parallel process streams.

When implemented by logic circuitry 808 of the processors 802, the machine-executable code 806 is to adapt the processors 802 to perform operations of examples disclosed herein. By way of non-limiting example, the machine-executable code 806 may adapt the processors 802 to perform the method 700 of FIG. 7. Also by way of non-limiting example, the machine-executable code 806 may adapt the processors 802 to perform operations disclosed herein for one or more of the physical layer device 102 of FIG. 1, the reduced complexity encoder 400 of FIG. 1 and FIG. 4, and the processing circuitry 402 of FIG. 4.

The processors 802 may include a general purpose processor, a special purpose processor, a central processing unit (CPU), a microcontroller, a programmable logic controller (PLC), a digital signal processor (DSP), an application specific integrated circuit (ASIC), a field-programmable gate array (FPGA) or other programmable logic device, discrete gate or transistor logic, discrete hardware components, other programmable device, or any combination thereof designed to perform the functions disclosed herein. A general-purpose computer including a processor is considered a special-purpose computer while the general-purpose computer is to execute functional elements corresponding to the machine-executable code 806 (e.g., software code, firmware code, hardware descriptions) related to examples of the present disclosure. It is noted that a general-purpose processor (may also be referred to herein as a host processor or simply a host) may be a microprocessor, but in the alternative, the processors 802 may include any conventional processor, controller, microcontroller, or state machine. The processors 802 may also be implemented as a combination of computing devices, such as a combination of a DSP and a microprocessor, a plurality of microprocessors, one or more microprocessors in conjunction with a DSP core, or any other such configuration.

In various examples the storage 804 includes volatile data storage (e.g., random-access memory (RAM)), non-volatile data storage (e.g., Flash memory, a hard disc drive, a solid state drive, erasable programmable read-only memory (EPROM), etc.). In various examples the processors 802 and the storage 804 may be implemented into a single device (e.g., a semiconductor device product, a system on chip (SOC), etc.). In various examples the processors 802 and the storage 804 may be implemented into separate devices.

In various examples the machine-executable code 806 may include computer-readable instructions (e.g., software code, firmware code). By way of non-limiting example, the computer-readable instructions may be stored by the storage 804, accessed directly by the processors 802, and executed by the processors 802 using at least the logic circuitry 808. Also by way of non-limiting example, the computer-readable instructions may be stored on the storage 804, transferred to a memory device (not shown) for execution, and executed by the processors 802 using at least the logic circuitry 808. Accordingly, in various examples the logic circuitry 808 includes electrically configurable logic circuitry 808.

In various examples the machine-executable code 806 may describe hardware (e.g., circuitry) to be implemented in the logic circuitry 808 to perform the functional elements. This hardware may be described at any of a variety of levels of abstraction, from low-level transistor layouts to high-level description languages. At a high-level of abstraction, a hardware description language (HDL) such as an IEEE Standard hardware description language (HDL) may be used. By way of non-limiting examples, VERILOG™, SYSTEMVERILOG™ or very large scale integration (VLSI) hardware description language (VHDL™) may be used.

HDL descriptions may be converted into descriptions at any of numerous other levels of abstraction as desired. As a non-limiting example, a high-level description can be converted to a logic-level description such as a register-transfer language (RTL), a gate-level (GL) description, a layout-level description, or a mask-level description. As a non-limiting example, micro-operations to be performed by hardware logic circuits (e.g., gates, flip-flops, registers, without limitation) of the logic circuitry 808 may be described in a RTL and then converted by a synthesis tool into a GL description, and the GL description may be converted by a placement and routing tool into a layout-level description that corresponds to a physical layout of an integrated circuit of a programmable logic device, discrete gate or transistor logic, discrete hardware components, or combinations thereof. Accordingly, in various examples the machine-executable code 806 may include an HDL, an RTL, a GL description, a mask level description, other hardware description, or any combination thereof.

In examples where the machine-executable code 806 includes a hardware description (at any level of abstraction), a system (not shown, but including the storage 804) may be to implement the hardware description described by the machine-executable code 806.

By way of non-limiting example, the processors 802 may include a programmable logic device (e.g., an FPGA or a PLC) and the logic circuitry 808 may be electrically controlled to implement circuitry corresponding to the hardware description into the logic circuitry 808. Also by way of non-limiting example, the logic circuitry 808 may include hard-wired logic manufactured by a manufacturing system (not shown, but including the storage 804) according to the hardware description of the machine-executable code 806.

Regardless of whether the machine-executable code 806 includes computer-readable instructions or a hardware description, the logic circuitry 808 is adapted to perform the functional elements described by the machine-executable code 806 when implementing the functional elements of the machine-executable code 806. It is noted that although a hardware description may not directly describe functional elements, a hardware description indirectly describes functional elements that the hardware elements described by the hardware description are capable of performing.

EXAMPLES

A non-exhaustive, non-limiting list of examples follows. Not each of the examples listed below is explicitly and individually indicated as being combinable with all others of the examples listed below and examples discussed above. It is intended, however, that these examples are combinable with all other examples unless it would be apparent to one of ordinary skill in the art that the examples are not combinable.

Example 1: An apparatus, comprising: a data storage device to store a first data part of a transmit data frame, the transmit data frame received from one or more higher network layers that are higher than a physical layer, the transmit data frame including the first data part and a second data part, the second data part comprising data bits having known values; and a processing circuitry to: retrieve the first data part of the transmit data frame from the data storage device; and determine parity vectors for the transmit data frame independently of the second data part responsive to the first data part.

Example 2: The apparatus of Example 1, wherein the known values of the second data part are zeros.

Example 3: The apparatus according to any one of Examples 1 and 2, wherein the processing circuitry is to divide the transmit data frame into an auxiliary bit, the first data part, and the second data part.

Example 4: The apparatus of Example 3, wherein: the determined parity vectors include a first parity vector and a second parity vector; and the processing circuitry is to determine the first parity vector independently of both the auxiliary bit and the second data part.

Example 5: The apparatus of Example 4, wherein the processing circuitry is to determine the second parity vector independently of the second data part and based, at least in part, on the auxiliary bit.

Example 6: The apparatus according to any one of Examples 3-5, wherein the auxiliary bit includes one bit, the first data part includes 1625 bits, and the second data part includes 97 bits.

Example 7: The apparatus according to any one of Examples 1-6, wherein the data storage device is further to store only a subset of a column of a generator matrix used to generate the parity vectors, the subset of the column of the generator matrix having fewer bits than an entirety of the column of the generator matrix.

Example 8: The apparatus of Example 7, wherein the subset of the column includes a same number of bits as the first data part.

Example 9: The apparatus according to any one of Examples 1-8, wherein the data storage device does not store the second data part.

Example 10: The apparatus according to any one of Examples 1-9, wherein the processing circuitry comprises a single-core processing core.

Example 11: A method of generating parity vectors, the method comprising: dividing, at a physical layer device, a first data part from a transmit data frame, the transmit data frame including at least the first data part and a second data part, the second data part comprising data bits having known values, the transmit data frame received from a network layer higher than a physical layer; and determining parity vectors for the transmit data frame independently of the second data part based, at least in part, on the first data part.

Example 12: The method of Example 11, comprising dividing an auxiliary bit from the transmit data frame.

Example 13: The method of Example 12, wherein the auxiliary bit includes one bit, the first data part includes 1625 bits, and the second data part includes 97 bits.

Example 14: The method according to any one of Examples 12 and 13, wherein determining the parity vectors independently of the second data part includes determining a first parity vector independently of the second data part and of the auxiliary bit.

Example 15: The method according to any one of Examples 11-14, wherein determining the parity vectors independently of the second data part includes determining a first parity vector responsive to the first data part and a subset of a column of a generator matrix (G-matrix).

Example 16: The method of Example 15, wherein the subset of the column of the G-matrix has a same number of bits as the first data part.

Example 17: The method according to any one of Examples 11-16, wherein determining the parity vectors independently of the second data part includes determining a second parity vector, which includes: segmenting a subset of an A-matrix, which is a subset of a parity-check matrix, into sub-matrices, a number of ones per row for each of the sub-matrices being less than or equal to five, a final column of the subset of the A-matrix including only five ones; storing only 35 bits per each row for each of the sub-matrices, every 7 bits of the 35 bits per each row indicating a location of one of the ones, if any, in a corresponding row; and multiplying the subset of the A-matrix by a transpose of the first data part responsive to the 35 bits per each row for each of the sub-matrices.

Example 18: The method of Example 17, wherein multiplying the subset of the A-matrix by a transpose of the first data part responsive to the 35 bits per each row for each of the sub-matrices includes performing the multiplying using five XOR gates.

Example 19: A communication system, comprising: a network interface to communicatively interface with a receiver; and a physical layer device including a reduced complexity encoder to: generate a low density parity-check code (LDPC) frame responsive to a first data part of a transmit data frame independently from a second data part of the transmit data frame, the transmit data frame received from higher network layers that are higher than a physical layer; and provide the LDPC frame through the network interface to the receiver.

Example 20: The communication system of Example 19, wherein the reduced complexity encoder is to use only subsets of a column of a generator matrix and an A-matrix to determine parity vectors of the LDPC frame.

Example 21: The communication system according to any one of Examples 19 and 20, wherein the reduced complexity encoder is to store data indicating locations of ones of a B-matrix and a subset of an A-matrix, the A-matrix and the B-matrix including subsets of a parity check matrix.

Example 22: An encoder for a physical layer device, the encoder comprising: logic circuitry configured to divide an incoming data vector received from a network layer higher than the physical layer into at least a first data part and a second data part, the second data part comprising data bits having known values; and determine parity vectors independently of the second data part responsive to the first data part; and a data storage device configured to store the first data part.

Example 23: The encoder of Example 22, wherein the known values of the second data part are zeros.

Example 24: The encoder according to any one of Examples 22 and 23, wherein the logic circuitry is configured to divide the incoming data vector into an auxiliary bit, the first data part, and the second data part.

Example 25: The encoder of Example 24, wherein: the parity vectors include a first parity vector and a second parity vector; the logic circuitry is configured to determine the first parity vector independently of both the auxiliary bit and the second data part; the logic circuitry is configured to determine the second parity vector independently of the second data part and based, at least in part, on the auxiliary bit.

Example 26: The encoder according to any one of Examples 22-25, wherein the data storage device is further configured to store only a subset of a column of a generator matrix used to generate the parity vectors, the subset of the column of the generator matrix having fewer bits than an entirety of the column of the generator matrix.

Example 27: The encoder of Example 26, wherein the subset of the column includes a same number of bits as the first data part.

Example 28: The encoder according to any one of Examples 22-27, wherein the data storage device is configured to not store the second data part.

Example 29: The encoder according to any one of Examples 22-28, wherein the logic circuitry comprises a single-core processing core.

Example 30: A method of generating parity vectors, the method comprising: dividing, at a physical layer device, an incoming data vector into at least a first data part and a second data part, the second data part comprising data bits having known values, the incoming data vector received from a network layer higher than a physical layer; and determining parity vectors independently of the second data part and based, at least in part, on the first data part.

Example 31: The method of Example 30, wherein dividing the incoming data vector into at least a first data part and a second data part includes dividing the incoming data vector into an auxiliary bit, the first data part including 1625 bits, and the second data part including 97 bits.

CONCLUSION

As used in the present disclosure, the terms "module" or "component" may refer to specific hardware implementations to perform the actions of the module or component and/or software objects or software routines that may be stored on and/or executed by general purpose hardware (e.g., computer-readable media, processing devices, etc.) of the computing system. In various examples, the different components, modules, engines, and services described in the present disclosure may be implemented as objects or processes that execute on the computing system (e.g., as separate threads). While some of the system and methods described in the present disclosure are generally described as being implemented in software (stored on and/or executed by general purpose hardware), specific hardware implementations or a combination of software and specific hardware implementations are also possible and contemplated.

As used in the present disclosure, the term "combination" with reference to a plurality of elements may include a combination of all the elements or any of various different subcombinations of some of the elements. For example, the phrase "A, B, C, D, or combinations thereof" may refer to any one of A, B, C, or D; the combination of each of A, B, C, and D; and any subcombination of A, B, C, or D such as A, B, and C; A, B, and D; A, C, and D; B, C, and D; A and B; A and C; A and D; B and C; B and D; or C and D.

Terms used in the present disclosure and especially in the appended claims (e.g., bodies of the appended claims) are generally intended as "open" terms (e.g., the term "including" should be interpreted as "including, but not limited to," the term "having" should be interpreted as "having at least," the term "includes" should be interpreted as "includes, but is not limited to," etc.).

Additionally, if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to examples containing only one such recitation, even when the same claim includes the introductory phrases "one or more" or "at least one" and indefinite articles such as "a" or "an" (e.g., "a" and/or "an" should be interpreted to mean "at least one" or "one or more"); the same holds true for the use of definite articles used to introduce claim recitations.

In addition, even if a specific number of an introduced claim recitation is explicitly recited, those skilled in the art will recognize that such recitation should be interpreted to mean at least the recited number (e.g., the bare recitation of "two recitations," without other modifiers, means at least two recitations, or two or more recitations). Furthermore, in those instances where a convention analogous to "at least one of A, B, and C, etc." or "one or more of A, B, and C, etc." is used, in general such a construction is intended to include A alone, B alone, C alone, A and B together, A and C together, B and C together, or A, B, and C together, etc.

Further, any disjunctive word or phrase presenting two or more alternative terms, whether in the description, claims, or drawings, should be understood to contemplate the possibilities of including one of the terms, either of the terms, or both terms. For example, the phrase "A or B" should be understood to include the possibilities of "A" or "B" or "A and B."

While the present disclosure has been described herein with respect to certain illustrated examples, those of ordinary skill in the art will recognize and appreciate that the present invention is not so limited. Rather, many additions, deletions, and modifications to the illustrated and described examples may be made without departing from the scope of the invention as hereinafter claimed along with their legal equivalents. In addition, features from one example may be combined with features of another example while still being encompassed within the scope of the invention as contemplated by the inventor.

What is claimed is:

1. An apparatus, comprising:
   a data storage device to store a first data part of a transmit data frame independently of a second data part of the transmit data frame, the transmit data frame received from one or more higher network layers that are higher than a physical layer, the transmit data frame including the first data part and the second data part, the second data part comprising data bits having known values; and
   a processing circuitry to:
   retrieve the first data part of the transmit data frame from the data storage device; and
   determine parity vectors for the transmit data frame responsive to the retrieved first data part, independently of the second data part.

2. The apparatus of claim 1, wherein the known values of the second data part are zeros.

3. The apparatus of claim 1, wherein the processing circuitry is to divide the transmit data frame into an auxiliary bit, the first data part, and the second data part.

4. The apparatus of claim 3, wherein:
   the determined parity vectors include a first parity vector and a second parity vector; and
   the processing circuitry is to determine the first parity vector independently of both the auxiliary bit and the second data part.

5. The apparatus of claim 4, wherein the processing circuitry is to determine the second parity vector independently of the second data part and based, at least in part, on the auxiliary bit.

6. The apparatus of claim 3, wherein the auxiliary bit includes one bit, the first data part includes 1625 bits, and the second data part includes 97 bits.

7. An apparatus, comprising:
   a data storage device to store a first data part of a transmit data frame, the transmit data frame received from one or more higher network layers that are higher than a physical layer, the transmit data frame including the first data part and a second data part, the second data part comprising data bits having known values,
   wherein the data storage device is further to store only a subset of a column of a generator matrix used to generate parity vectors, the subset of the column of the generator matrix having fewer bits than an entirety of the column of the generator matrix; and
   a processing circuitry to:
   retrieve the first data part of the transmit data frame from the data storage device; and
   determine parity vectors for the transmit data frame independently of the second data part responsive to the first data part.

8. The apparatus of claim 7, wherein the subset of the column includes a same number of bits as the first data part.

9. The apparatus of claim 1, wherein the data storage device does not store the second data part.

10. The apparatus of claim 1, wherein the processing circuitry comprises a single-core processing core.

11. A method of generating parity vectors, the method comprising:
    dividing, at a physical layer device, a first data part from a second data part of a transmit data frame, the transmit data frame including at least the first data part and the second data part, the second data part comprising data bits having known values, the transmit data frame received from a network layer higher than a physical layer; and
    determining parity vectors for the divided transmit data frame based, at least in part, on the first data part, independently of the second data part.

12. The method of claim 11, comprising dividing an auxiliary bit from the transmit data frame.

13. The method of claim 12, wherein the auxiliary bit includes one bit, the first data part includes 1625 bits, and the second data part includes 97 bits.

14. The method of claim 12, wherein determining the parity vectors independently of the second data part includes determining a first parity vector independently of the second data part and of the auxiliary bit.

15. A method of generating parity vectors, the method comprising:
    dividing, at a physical layer device, a first data part from a transmit data frame, the transmit data frame including at least the first data part and a second data part, the second data part comprising data bits having known values, the transmit data frame received from a network layer higher than a physical layer; and
    determining parity vectors for the transmit data frame independently of the second data part based, at least in part, on the first data part,
    wherein determining the parity vectors independently of the second data part includes determining a first parity vector responsive to the first data part and a subset of a column of a generator matrix (G-matrix).

16. The method of claim 15, wherein the subset of the column of the G-matrix has a same number of bits as the first data part.

17. A method of generating parity vectors, the method comprising, comprising:
    dividing, at a physical layer device, a first data part from a transmit data frame, the transmit data frame including at least the first data part and a second data part, the second data part comprising data bits having known values, the transmit data frame received from a network layer higher than a physical layer; and
    determining parity vectors for the transmit data frame independently of the second data part based, at least in part, on the first data part,
    wherein determining the parity vectors independently of the second data part includes determining a second parity vector, which includes:
    segmenting a subset of an A-matrix, which is a subset of a parity-check matrix, into sub-matrices, a number of ones per row for each of the sub-matrices being less than or equal to five, a final column of the subset of the A-matrix including only five ones;

storing only 35 bits per each row for each of the sub-matrices, every 7 bits of the 35 bits per each row indicating a location of one of the ones, if any, in a corresponding row; and multiplying the subset of the A-matrix by a transpose of the first data part responsive to the 35 bits per each row for each of the sub-matrices.

18. The method of claim 17, wherein multiplying the subset of the A-matrix by a transpose of the first data part responsive to the 35 bits per each row for each of the sub-matrices includes performing the multiplying using five XOR gates.

19. A communication system, comprising:
a network interface to communicatively interface with a receiver; and
a physical layer device including a reduced complexity encoder to:
generate a low density parity-check code (LDPC) frame responsive, at least in part, only to a first data part of a transmit data frame independently from a second data part of the transmit data frame, the transmit data frame received from higher network layers that are higher than a physical layer; and
provide the generated LDPC frame through the network interface to the receiver.

20. A communication system, comprising:
a network interface to communicatively interface with a receiver; and
a physical layer device including a reduced complexity encoder to:
generate a low density parity-check code (LDPC) frame responsive to a first data part of a transmit data frame independently from a second data part of the transmit data frame, the transmit data frame received from higher network layers that are higher than a physical layer; and
provide the LDPC frame through the network interface to the receiver,
wherein the reduced complexity encoder is to use only subsets of a column of a generator matrix and an A-matrix to determine parity vectors of the LDPC frame.

21. A communication system, comprising:
a network interface to communicatively interface with a receiver; and
a physical layer device including a reduced complexity encoder to:
generate a low density parity-check code (LDPC) frame responsive to a first data part of a transmit data frame independently from a second data part of the transmit data frame, the transmit data frame received from higher network layers that are higher than a physical layer; and
provide the LDPC frame through the network interface to the receiver,
wherein the reduced complexity encoder is to store data indicating locations of ones of a B-matrix and a subset of an A-matrix, the A-matrix and the B-matrix including subsets of a parity check matrix.

* * * * *